United States Patent [19]

Gimm et al.

[11] Patent Number: 5,281,350
[45] Date of Patent: Jan. 25, 1994

[54] GLASS ETCHING COMPOSITION

[75] Inventors: Soon Ho Gimm, Seoul; Jung Hyang Kim, Inchon, both of Rep. of Korea

[73] Assignee: Tae Hwan Kim, Seoul, Rep. of Korea

[21] Appl. No.: 968,951

[22] Filed: Oct. 30, 1992

[30] Foreign Application Priority Data

Aug. 14, 1992 [KR] Rep. of Korea ............ 92-14675

[51] Int. Cl.$^5$ .......................................... H01L 21/00
[52] U.S. Cl. .............................. 252/79.1; 252/79.3; 252/79.4; 156/663; 156/637; 65/31
[58] Field of Search ............... 252/79.1, 79.2, 79.3, 252/79.4; 156/663, 637; 65/31

[56] References Cited

U.S. PATENT DOCUMENTS

| | | | |
|---|---|---|---|
| 3,374,141 | 3/1968 | Junge et al. | 161/1 |
| 3,551,228 | 12/1970 | Meth et al. | 156/24 |
| 3,616,098 | 10/1971 | Falls | 252/79.3 |
| 3,642,549 | 2/1972 | Couture et al. | 252/79.3 |
| 3,769,113 | 10/1973 | Gruenke, Jr. | 65/31 |
| 4,781,792 | 11/1988 | Hogan | 252/79.3 |
| 4,921,626 | 5/1990 | Rhodenbough | 252/79.4 |

FOREIGN PATENT DOCUMENTS

| | | |
|---|---|---|
| 153360 | 1/1982 | Fed. Rep. of Germany . |
| 53-061968 | 6/1978 | Japan . |
| 1-125831 | 5/1989 | Japan . |

Primary Examiner—Tom Thomas
Assistant Examiner—George Goudreau
Attorney, Agent, or Firm—Millen, White, Zelano, & Branigan

[57] ABSTRACT

The present invention provides an improved glass etching composition which does not contain any causative materials such as hydrofluoric acid, causing environmental pollution. The etching composition comprises a first solution of a flow modifier and ammonium bifluoride in purified glycerine; and a second solution of ammonium bifluoride and ferric chloride in purified glycerine.

5 Claims, No Drawings

GLASS ETCHING COMPOSITION

FIELD OF THE INVENTION

The present invention relates to a glass etching composition and a method for etching a glass surface therewith.

DESCRIPTION OF THE PRIOR ART

Several methods for etching glass articles are known in the art. Among these, a conventional method is to treat a glass surface with an etching solution comprising hydrofluoric acid as an active ingredient.

However, hydrofluoric acid is now recognized as a major causative substance which may give rise to the problem of environmental pollution, and has thus been refrained from use in many countries. Moreover, since hydrofluoric acid is very toxic and fatal to the human body, there have existed serious problems in terms of the safety and health of workers in the field handling the same. For example, when the skin is exposed to hydrofluoric acid, it usually induces a sharp pain and may injure or destroy the skin tissue. In addition, hydrofluoric acid vapor may cause aphasia to a worker when it invades his throat upon inhalation. A pulmonary edema may result if the vapor invades the lungs. In the worst case, the liver may be injured by the vapor, and the injury may subsequently result in death. In order to minimize the accidents that may arise from the use of hydrofluoric acid in glass etching, extensive efforts have heretofore been exerted. As a result, a variety of auxiliary facilities has been developed for preventing the environmental pollution and physical injury to workers. However, these efforts do not solve the problems mentioned above.

Furthermore, the etching method involving the use of hydrofluoric acid suffers from the drawback that it is difficult to engrave or etch a complex pattern or character on glass with it. In an attempt to overcome this drawback, it has been suggested to conduct the etching process using the so-called "silk screen printing technique." However, since the printing inks currently used cannot endure strong acidic etchants such as hydrofluoric acid, the printing technique is rarely practiced in the field of processing of the glass articles.

An attempt has been made to reduce or avoid the use of hydrofluoric acid which has been a fundamental cause for the problems mentioned above. A representative approach involves the use of ammonium bifluoride in place of hydrofluoric acid. For example, U.S. Pat. Nos. 2,622,016 and 3,616,098 teach an etching method employing ammonium bifluoride in combination with hydrofluoric acid. U.S. Pat. No. 4,921,626 discloses a glass etching composition comprising ammonium bifluoride, xanthum gum, water, and propylene glycol.

We, the inventors, have intensively conducted a wide range of studies in order to develop an improved glass etching composition which does not contain hydrofluoric acid and contains ammonium bifluoride in a reduced amount. As a result, the inventors have discovered that a glass etching composition containing ammonium bifluoride as an etchant for glass and purified glycerine as a solvent exhibits improved workabilities and good compatibilities to silk screen printing.

SUMMARY OF THE INVENTION

It is an object of the invention to provide an improved glass etching composition which solves the problems of environmental pollution and the physical injury to workers.

It is another object of the invention to provide an improved glass etching composition which can engrave an exquisite pattern or character on glass by the silk screen printing technique, which is a far advanced engraving method compared with the conventional method using masking tapes.

These and other objects of the invention can be accomplished by an improved glass etching composition according to the invention comprising a first solution of a flow modifier and ammonium bifluoride in purified glycerine; and a second solution of ammonium bifluoride and ferric chloride in purified glycerine.

A further objects of the invention will become apparent through reading the remainder of the specification.

DETAILED DESCRIPTION OF THE INVENTION

According to the present invention, a glass etching composition is provided, which comprises the following two solutions:

(a) a first solution of 25 to 35 parts by weight of a flow modifier and 25 to 35 parts by weight of ammonium bifluoride in 100 parts by weight of purified glycerine; and (b) a second solution of 25 to 35 parts by weight of ammonium bifluoride and 10 to 15 parts by weight of ferric chloride in 100 parts by weight of purified glycerine.

The proportional ratio by weight of the first and the second solutions is within the range from 1:1 to 2:1.

Specifically, the first solution is prepared by heating a solution of a flow modifier in purified glycerine in a water bath, adding ammonium bifluoride thereto, and then agitating and cooling the resulting mixture to room temperature. The second solution is prepared by heating purified glycerine in a water bath, adding ammonium bifluoride and ferric chloride thereto in the order, and then agitating and cooling the resulting mixture to room temperature, followed by removing any precipitates by filtration.

The glass etching composition according to the invention does not contain the highly toxic hydrofluoric acid. Moreover, the etching composition of the invention contains the less toxic ammonium bifluoride in an amount less than that in the prior art glass etching compositions.

The reduction in the amount of ammonium bifluoride in the glass etching composition of the invention is attributed to the use of purified glycerine. The presence of purified glycerine serves to enhance the glass etching activity of ammonium bifluoride. Thus, according to the invention, it is possible to use ammonium bifluoride in the etching composition of the invention by an amount less than that in the conventional glass etching compositions. Glycerine has been widely used in the field of manufacturing of cosmetics, foodstuffs, perfumes, antifreezing solutions, and so forth. This material has also been often used as a solvent for various chemicals. Any known, purified glycerine which is nontoxic and harmless to the human body may be used in the etching composition of the invention.

A flow modifier is added in the first solution of the glass etching composition according to the invention in order to control the flow rate of the etching composition when the composition flows downward on the surface of the glass. These modifiers may include sugar, starch syrup, grain syrup, honey, and the like. Among these, sugar is preferred in view of the fact that it exhibits an additional function of inhibiting the ammonium bifluoride from being reduced at a lower temperature.

Ferric chloride is added to the second solution of the composition of the invention. By adding this component to the second solution, the glass etching activity of the ammonium bifluoride component contained can be enhanced.

The glass etching composition according to the invention may optionally contain an amount of water in addition to the first and the second solutions. The amount of water to be used can be varied within a wide range depending on both the types of the etching methods and the chemical properties of the glass to which the etching composition is applied. Generally, it is suitable to add water in an amount of about 10% based on the total weight of the first and the second solutions of the etching composition.

The composition of the invention is preferably used to etch glass articles in accordance with any of the conventional methods of etching glass. In a preferred embodiment, the glass surface is first cleaned by flushing with water and wiping the glass dry. After cleaning, the surface of the glass where etching is not required is optionally protected from being contacted with the etching composition by applying a masking tape made of the conventional etchant-resistant materials on the surface of glass. Then, the glass, article, with portions covered with the masking tape, is treated with the etching composition of the invention in a conventional manner, for example, by dipping the glass into the etching composition or spraying the etching composition onto a surface the glass article. The time required for treating the glass with the etching composition depends on the object of the etching. However, it may be usually completed within 2 to 3 minutes. After completion of the etching treatment, the glass is cleaned again with water to remove the residual etching composition therefrom.

In the case where a sophisticated pattern or character is to be marked on the surface of glass, it is possible to conduct the etching by means of the silk screen printing techniques conventionally known in the art. The printing inks that have been conventionally used in the silk screen printing techniques are not deteriorated by the etching composition of the invention because it contains no strong acidic component such as hydrofluoric acid. Thus, the etching composition of the invention may also be successfully used in the etching process utilizing the silk screen printing technique. The glass articles obtained by employing this etching method have such various and exquisite patterns or characters that may attract the consumer's attention.

DESCRIPTION OF THE PREFERRED EMBODIMENTS

The present invention will be illustrated in greater detail by way of the following example. The example is presented for illustration purpose only and should not be construed as limiting the invention which is properly delineated in the claims.

EXAMPLE 0.9 Kg of sugar was added to 3 kg of purified glycerine to solution. The mixture was heated in a water bath at 90° C. for 30 minutes. To the mixture, 0.9 kg of ammonium bifluoride was added immediately. The resulting mixture was thoroughly agitated and cooled to room temperature to give a first solution.

Separately, 3 kg of purified glycerine was heated in a water bath at 90° C. for 30 minutes, and then 0.9 kg of ammonium bifluoride was added thereto. After adding 0.3 kg of ferric chloride, the resulting mixture was thoroughly agitated and cooled to room temperature. The precipitates were filtered off to give a second solution.

The first and the second solutions thus obtained were then admixed in a ratio by weight of 1:1 to 2:1 to give a glass etching composition according to the invention.

What is claimed is:

1. A glass etching composition comprising:
   (a) a first solution of 25 to 35 parts by weight of a flow modifier and 25 to 35 parts by weight of ammonium bifluoride in 100 parts by weight of glycerine; and
   (b) a second solution of 25 to 35 parts by weight of ammonium bifluoride and 10 to 15 parts by weight of ferric chloride in 100 parts by weight of glycerine, the proportional ratio by weight of the first and the second solutions being within the range from 1:1 to 2:1.

2. The glass etching composition according to claim 1 wherein water is present therein in an amount of about 10% based on the total weight of said glass etching composition.

3. The glass etching composition according to claim 1 wherein said flow modifier is selected from the group consisting of sugar, starch syrup, grain syrup, and honey.

4. The glass etching composition according to claim 1 wherein said first solution is prepared by heating a solution of a flow modifier in purified glycerine in a water bath, adding ammonium bifluoride thereto, and then agitating and cooling the resulting mixture to room temperature; and said second solution is prepared by heating purified glycerine in a water bath, adding ammonium bifluoride and ferric chloride thereto in the order, and then agitating and cooling the resulting mixture to room temperature, followed by removing any precipitates by filtration.

5. The glass etching composition according to claim 2 wherein said flow modifier is selected from the group consisting of sugar, starch syrup, grain syrup, and honey.

* * * * *